March 17, 1964 H. A. WAGNER 3,125,709

SEMICONDUCTOR COMPONENT AND HOUSING ASSEMBLY

Filed Oct. 17, 1960

WITNESSES

Edwin E. Basler

Raymond T. Majesko

INVENTOR

Howard A. Wagner

BY

Frederick Shapoe

ATTORNEY

United States Patent Office 3,125,709
Patented Mar. 17, 1964

3,125,709
SEMICONDUCTOR COMPONENT AND HOUSING ASSEMBLY

Howard A. Wagner, Pittsburgh, Pa., assignor to Westinghouse Electric Corporation, East Pittsburgh, Pa., a corporation of Pennsylvania Filed Oct. 17, 1960, Ser. No. 63,202
3 Claims. (Cl. 317—234)

The present invention pertains to an improved semiconductor device and a method for making the same.

Heretofore in the fabrication of semiconductor devices, it has been a practice to attach a semiconductor member to a base and subsequently cover the member with a cap or header which is soldered or welded to the base. This process may often introduce some undesirable effects such as contaminating the semiconductor member with a flux when soldering, or shorting the member with weld splashes or overheating the semiconductor member during welding. It is possible to overcome some of these drawbacks by cold welding, but another disadvantage appears when cold welding in that the heat dissipating means in many cases is drastically reduced in area by the great reduction in thickness under the weld area that is required in order to produce a tight weld.

It is an object of this invention to provide a semiconductor device in which a header member enclosing a semiconductor member mounted on a heat sink is mechanically joined to the heat sink without materially reducing the area of the heat sink to a degree that is detrimental to the effective operation of the semiconductor member.

Another object of the invention is to provide a semiconductor device comprising an open ended cylindrical shell having a peripheral flange at the lower end thereof disposing a semiconductor member within the shell, said member being electrically connected to an electrical conductor electrically insulated from the cylindrical shell by an insulating washer disposed on the upper end of the shell, the peripheral flange of the shell being inserted in a circular groove disposed on a heat dissipating and support plate for the semiconductor member and being affixed thereto by staking the outer circumferential edge of the groove onto the upper surface of the flange.

Another object of the invention is to provide a process for producing a reliable hermetically sealed semiconductor device, the steps comprising disposing an open ended cylindrical shell having a peripheral flange at the lower end thereof on a heat dissipating and support plate, the peripheral flange of the shell being inserted in a circular groove disposed on the plate and affixing the flange thereto by staking the outer circumferential edge of the groove onto the upper surface of the flange to effect a hermetic seal.

Other objects of the invention will in part be obvious and will in part appear hereinafter.

For a better understanding of the nature and objects of the invention, reference should be had to the following detailed description and drawings, in which.

In accordance with the present invention and in attainment of the foregoing objects there is provided a hermetically sealed semiconductor device comprising (1) an open ended cylindrical shell having an outer peripheral flange at the extreme lower end thereof and an inner peripheral lip near the extreme upper end thereof, (2) an insulating washer, having an electrical conductor passing therethrough, is disposed on the peripheral lip of the shell and is bonded to the inner periphery of the shell, (3) a semiconductor member is disposed within the shell and is joined on one surface to a heat dissipating and support plate on which the flanged portion of the shell rests, (4) the semiconductor member is electrically connected to the electrical conductor by a spring or coil or the like and (5) the flanged portion of the cylindrical shell is seated in a circular groove in the support plate, the groove circumscribing the semiconductor member, and is affixed thereto by crimping or staking the outer circumferential edge of the groove onto the upper surface of the flange, thus providing a hermetic enclosure for the semiconductor member.

Figure 1:
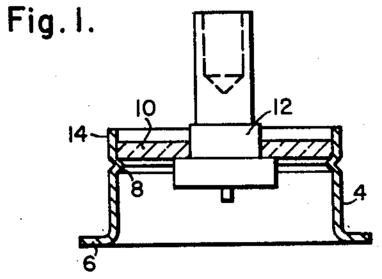
FIGURE 1 is an elevational view partly in cross section of a portion of a semiconductor device before assembly.

With reference to FIG. 1 there is shown an open ended cylindrical shell 4 having a peripheral flange 6 and an inner peripheral lip 8 on which an insulating washer 10, for example, of glass, having an electrical conductor 12 passing therethrough is disposed. An extension 14 of the shell 4 extends a slight distance above the top surface of washer 10. After assembly, the washer is soldered along the inner periphery of the shell by a technique well known to those skilled in the art. The electrical conductor 12 may be joined to the washer 10 either prior to or subsequent to affixing the washer within the shell 4. The same or similar techniques may be used to join the electrical conductor as was used in joining the washer to the shell.

Figure 2:
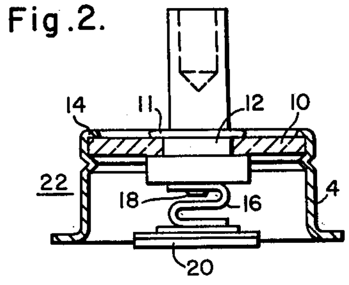
FIG. 2 is an elevational view partly in cross section of a partially assembled semiconductor device.

The extension 14 of shell 4 is thereafter staked or peened onto the top surface of washer 10 thereby providing a tight cap thereon as is shown in FIG. 2. It should be understood that the washer 10 may be bonded as by soldering to the extreme upper end of the shell 4. The showing in FIG. 1 with the extension being present is a preferred embodiment of the invention. Also indicated in FIG. 2 is a modification that may be used in joining the conductor 12 to the washer 10. A peripheral ear may be machined on conductor 12 and staked over the inner diameter of the washer 10 to form an overlapping sealing portion 11. A spring or coil lead 16 is then joined to the lower end of electrical conductor 12. The spring lead 16 may be directly soldered thereto or mechanically attached by slipping a perforation in the end of the spring lead over a nipple 18 projecting from conductor 12. The other end of the spring lead 16 is soldered to a semiconductor member 20. The soldered unit forms an assembly 22 as shown in FIG. 2.

Figure 3:
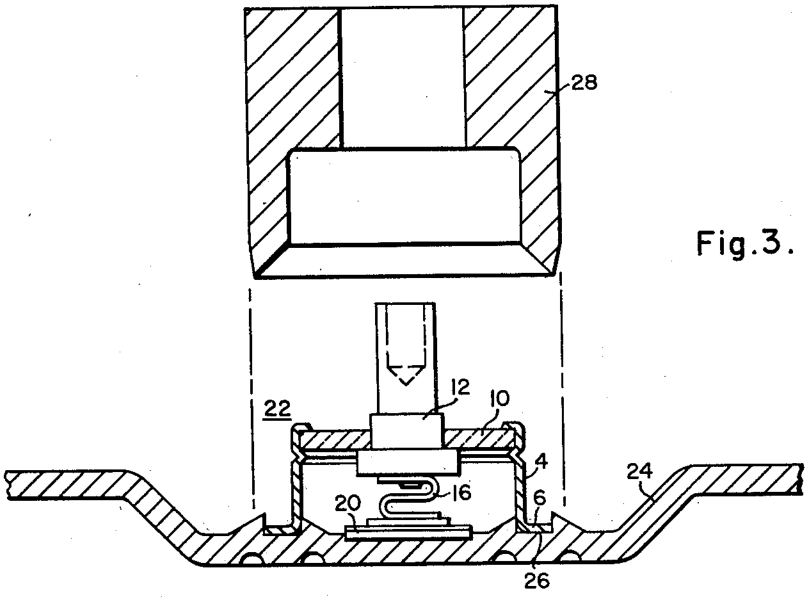
FIG. 3 is an elevational view partly in cross section of a semiconductor device disposed on a heat sink.

The assembly 22 is then disposed on a heat dissipating and support plate 24 as shown in FIG. 3. While the plate 24 is dished, it may be of a flat or other configuration. The flange 6 of the cylindrical shell 4 closely fits into a circular groove 26 in the support plate 24 which groove circumscribes the semiconductor member 20. The semiconductor member 20 is first soldered to the upper surface of the support plate 24 before lowering the cylindrical shell 4 so as to enclose the member 20 within the periphery of the cylindrical shell. The spring lead 16 allows the member 20 to be resiliently moved into or out of the shell 4 for this purpose.

Figure 4:
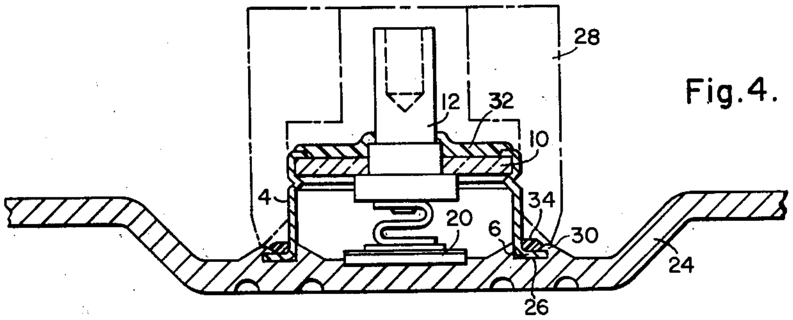
FIG. 4 is an elevational view partly in cross section of a completed semiconductor device.

A staking tool 28 is then placed over the assembly 22 and sufficient force is used to peen or stake the outer circumferential edge 30 of the circular groove 26 onto the top surface of the flange 6 as shown in FIG. 4 thus effecting a hermetic enclosure for the semiconductor member 20. To further insure an air-tight enclosure the device may be coated with a layer 32 and 34 of a resin such, for example, as a silicone or epoxy resin applied to the area of the washer 10 and edge 30.

The completed device as shown in FIG. 4 was prepared using a diode comprising a silicon wafer mounted between two molybdenum electrodes to form the semiconductor member. The shell 4 was comprised of a metal such as the alloy known as Kovar. The base 24 can be and preferably should be the same metal as the shell 4.

It is to be understood that the above description and drawings be interpreted as illustrative and not limiting.

I claim as my invention:

1. A semiconductor device comprising an open ended cylindrical shell having an outer peripheral flange at the extreme lower end thereof and an inner peripheral lip near the extreme upper end thereof; an insulating washer having an electrical conductor passing therethrough, disposed on the inner peripheral lip of the shell and joined to the inner periphery of the shell, a section of the shell being swaged onto the top surface of the washer; an electrically conductive member joined at one end to the lower end of the electrical conductor passing through the insulating washer, the other end being soldered to a semiconductor member which is disposed within the shell; a shaped heat dissipating and support plate having a circular groove within which the peripheral flange of the cylindrical shell is disposed and closely fits therein, the semiconductor member being soldered to the top surface of the plate, and the outer circumferential edge of the groove being staked onto the upper surface of the flange thereby affixing the flange in the groove and providing a hermetic enclosure for the semiconductor member.

2. A semiconductor device comprising an open ended cylindrical shell having an outer peripheral flange at the extreme lower end thereof and an inner peripheral lip near the extreme upper end thereof; an insulating washer having an electrical conductor passing therethrough and disposed on the inner peripheral lip of the shell and joined to the inner periphery of the shell, a section of the shell being swaged onto the top surface of the washer and a cured resinous material being applied on the top surface of the washer and the swaged segment to effect a hermetic seal; an electrically conductive member joined at one end to the lower end of the electrical conductor passing through the insulating washer, the other end being soldered to a semiconductor member which is disposed within the shell; a shaped heat dissipating and support plate having a circular groove, within which the peripheral flange of the cylindrical shell is disposed, and closely fits therein, the semiconductor member being soldered to the top surface of the plate, and the outer circumferential edge of the groove being staked onto the upper surface of the flange thereby affixing the flange in the groove and providing a hermetic enclosure for the semiconductor member.

3. A semiconductor device comprising an open ended cyclindrical shell having a peripheral flange at the extreme lower end thereof; an insulating washer, having an electrical conductor passing therethrough, soldered to the inner periphery of the shell at the extreme upper end thereof; an electrical conductive member joined on one surface to the lower end of the electrical conductor passing through the insulating washer, another surface being soldered to a semiconductor member; a shaped heat dissipating and support plate, having a circular groove, on which the cylindrical shell is disposed, the flanged segment of the shell closely fitting in the circular groove, the semiconductor member disposed within the shell being soldered to the top surface of the plate and the outer circumferential edge of the groove being staked onto the upper surface of the flange thereby affixing the flange in the groove and providing a hermetic enclosure for the semiconductor member.

References Cited in the file of this patent

UNITED STATES PATENTS

| | | |
|---|---|---|
| 2,129,089 | Hood | Sept 6, 1938 |
| 2,794,942 | Cooper | June 4, 1957 |
| 2,825,014 | Willemse | Feb. 25, 1958 |
| 2,864,980 | Mueller | Dec. 16, 1958 |
| 2,866,928 | Blundell | Dec. 30, 1958 |
| 2,898,668 | Knott et al. | Aug. 11, 1959 |
| 2,945,992 | Bollert et al. | July 19, 1960 |
| 2,947,922 | Junker | Aug. 2, 1960 |
| 2,972,096 | Johnson | Feb. 14, 1961 |
| 3,015,760 | Weil | Jan. 2, 1962 |
| 3,024,299 | Nijhuis et al. | Mar. 6, 1962 |